US011107620B2

United States Patent
Kanno et al.

(10) Patent No.: US 11,107,620 B2
(45) Date of Patent: Aug. 31, 2021

(54) COIL COMPONENT

(71) Applicant: SUMIDA CORPORATION, Tokyo (JP)

(72) Inventors: Tomoyuki Kanno, Natori (JP); Hiroyuki Momoi, Natori (JP)

(73) Assignee: SUMIDA CORPORATION, Tokyo (JP)

( * ) Notice: Subject to any disclaimer, the term of this patent is extended or adjusted under 35 U.S.C. 154(b) by 273 days.

(21) Appl. No.: 16/107,322

(22) Filed: Aug. 21, 2018

(65) Prior Publication Data

US 2019/0252108 A1    Aug. 15, 2019

(30) Foreign Application Priority Data

Aug. 23, 2017    (JP) .............................. JP2017-160146

(51) Int. Cl.
*H01F 27/29*    (2006.01)
*H01F 27/28*    (2006.01)
(Continued)

(52) U.S. Cl.
CPC ......... *H01F 27/2804* (2013.01); *H01F 27/24* (2013.01); *H01F 41/041* (2013.01);
(Continued)

(58) Field of Classification Search
CPC ........... H01F 2017/002; H01F 27/2804; H01F 27/27; H01F 2027/2809; H01F 2027/2819;
(Continued)

(56) References Cited

U.S. PATENT DOCUMENTS

| | | | |
|---|---|---|---|
| 5,521,573 A * | 5/1996 | Inoh | H01F 27/2804 |
| | | | 336/180 |
| 6,000,128 A | 12/1999 | Umeno et al. | |

(Continued)

FOREIGN PATENT DOCUMENTS

| | | |
|---|---|---|
| JP | H03183106 A | 8/1991 |
| JP | 05135968 A * | 6/1993 |

OTHER PUBLICATIONS

Extended European Search Report corresponding to Application No. 18189697.8-1203; dated Jan. 7, 2109.

(Continued)

*Primary Examiner* — Mang Tin Bik Lian
(74) *Attorney, Agent, or Firm* — Cantor Colburn LLP

(57) ABSTRACT

For a substrate of a coil component, there are arranged a plurality of through-holes; the pattern-wiring is provided with a loop-shaped portion surrounding the circumference of a center hole which penetrates the substrate a pair of end portions which extend from that loop-shaped portion; and the neighboring two through-holes within the plurality of through-holes penetrate the substrate in a state that at least a part of each of the openings thereof superimpose each of the pair of end portions and is connected electrically with each of the end portions. In addition, the opening of one of the through-holes at one of the end portions within the pair of end portions is provided at a biased position close to the other of the end portions with respect to the center of the one of the end portions in the intersecting-direction.

7 Claims, 14 Drawing Sheets

(51) Int. Cl.
*H05K 1/11* (2006.01)
*H01F 27/24* (2006.01)
*H01F 41/04* (2006.01)
*H05K 1/14* (2006.01)
*H05K 3/46* (2006.01)
*H01F 17/00* (2006.01)
*H05K 1/16* (2006.01)

(52) U.S. Cl.
CPC .......... *H05K 1/113* (2013.01); *H01F 17/0013* (2013.01); *H01F 2017/002* (2013.01); *H01F 2027/2809* (2013.01); *H01F 2027/2819* (2013.01); *H05K 1/114* (2013.01); *H05K 1/144* (2013.01); *H05K 1/165* (2013.01); *H05K 3/4611* (2013.01); *H05K 3/4638* (2013.01); *H05K 2201/041* (2013.01); *H05K 2201/096* (2013.01); *H05K 2201/09063* (2013.01); *H05K 2201/09672* (2013.01); *H05K 2203/166* (2013.01)

(58) Field of Classification Search
CPC ...... H01F 41/041; H05K 1/113; H05K 1/165; H05K 1/144; H05K 1/114; H05K 2203/166; H05K 3/4638; H05K 3/4611; H05K 2201/041; H05K 2201/09063; H05K 2201/09672; H05K 2201/096

USPC ................................. 336/212, 221, 192, 200
See application file for complete search history.

(56) References Cited

U.S. PATENT DOCUMENTS

| | | | |
|---|---|---|---|
| 8,502,632 B2* | 8/2013 | Suganuma | H02M 3/155 336/200 |
| 2005/0212640 A1* | 9/2005 | Chiang | H01F 27/2804 336/200 |
| 2011/0050380 A1* | 3/2011 | Nakanishi | H01F 27/341 336/200 |
| 2015/0102890 A1* | 4/2015 | Nakamura | H01F 41/042 336/200 |
| 2016/0055958 A1* | 2/2016 | Chen | H05K 1/115 336/200 |

OTHER PUBLICATIONS

Jordi-Roger Riba, "Calculation of the ac to dc resistance ratio of conductive nonmagnetic straight conductors by applying FEM stimulations", European Journal of Physics, vol. 36, No. 5, Jul. 17, 2015 (Jul. 17, 2015), p. 055019, XP055536391, GB.

* cited by examiner

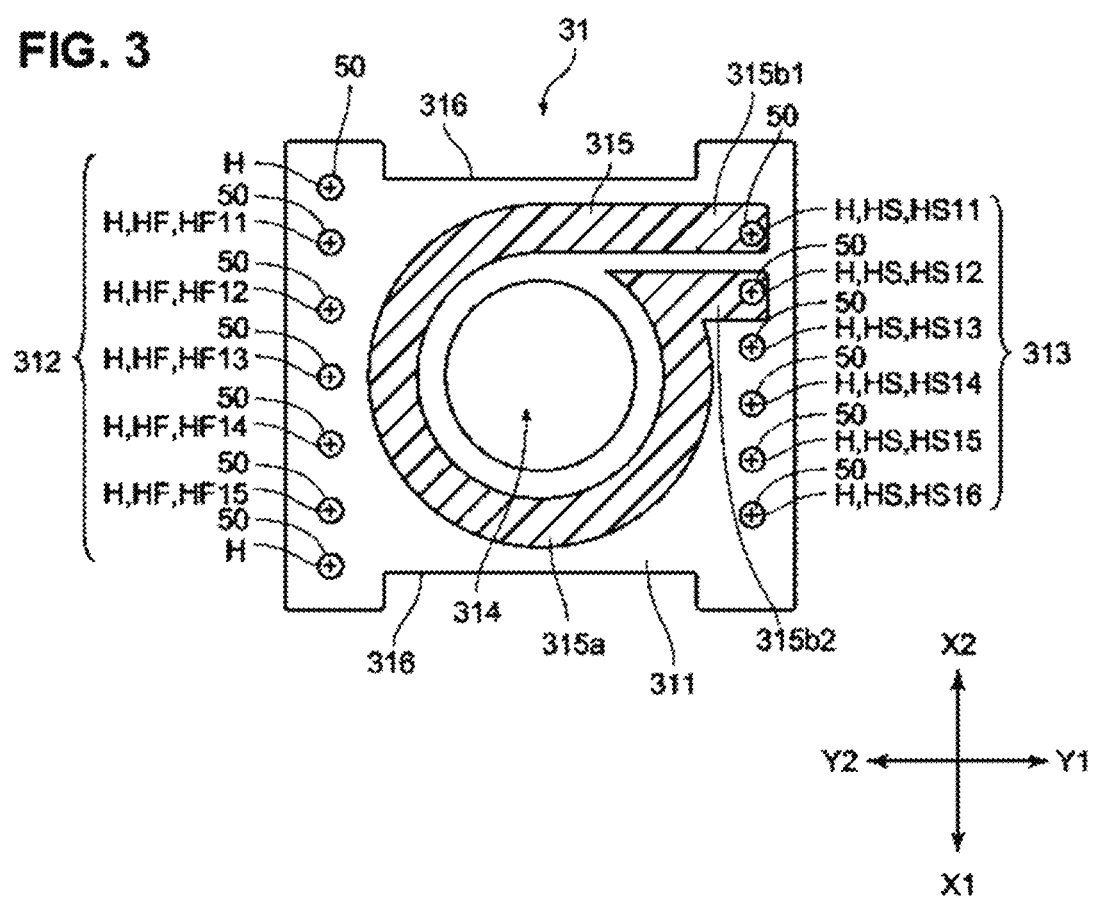

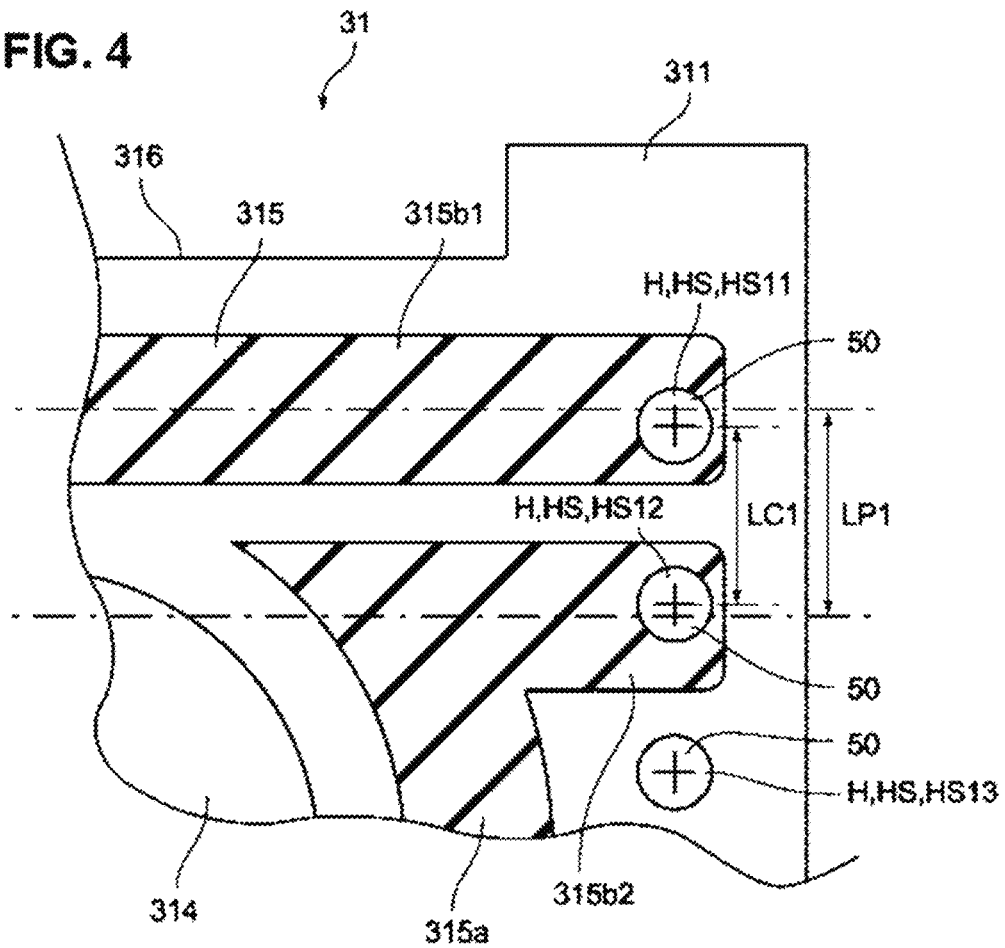

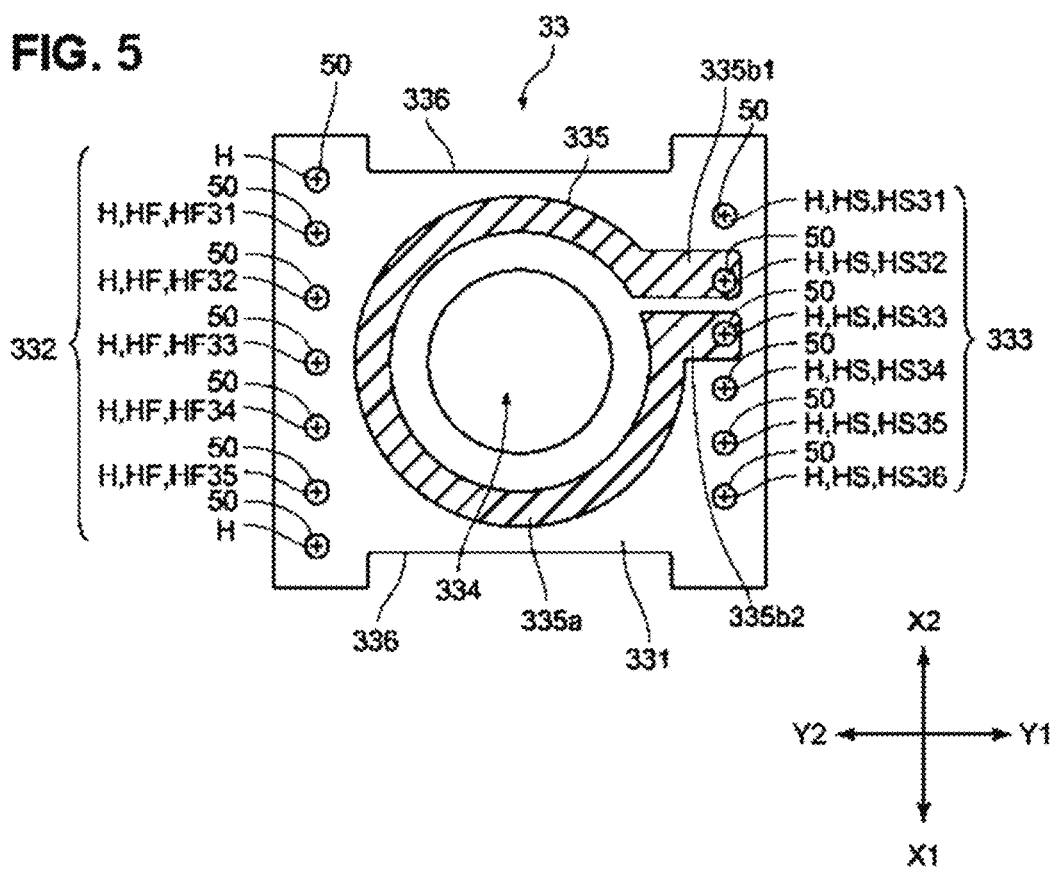

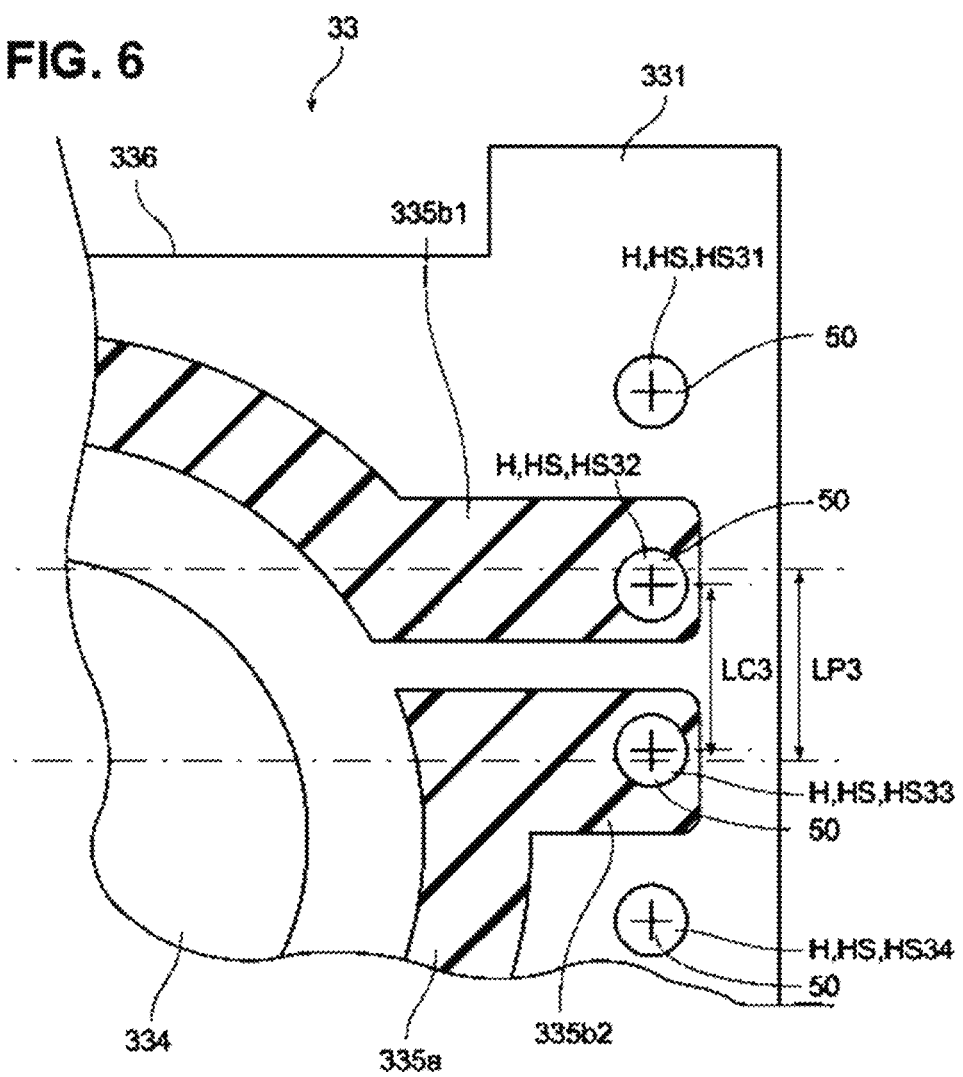
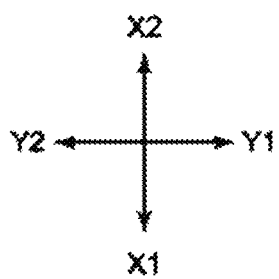

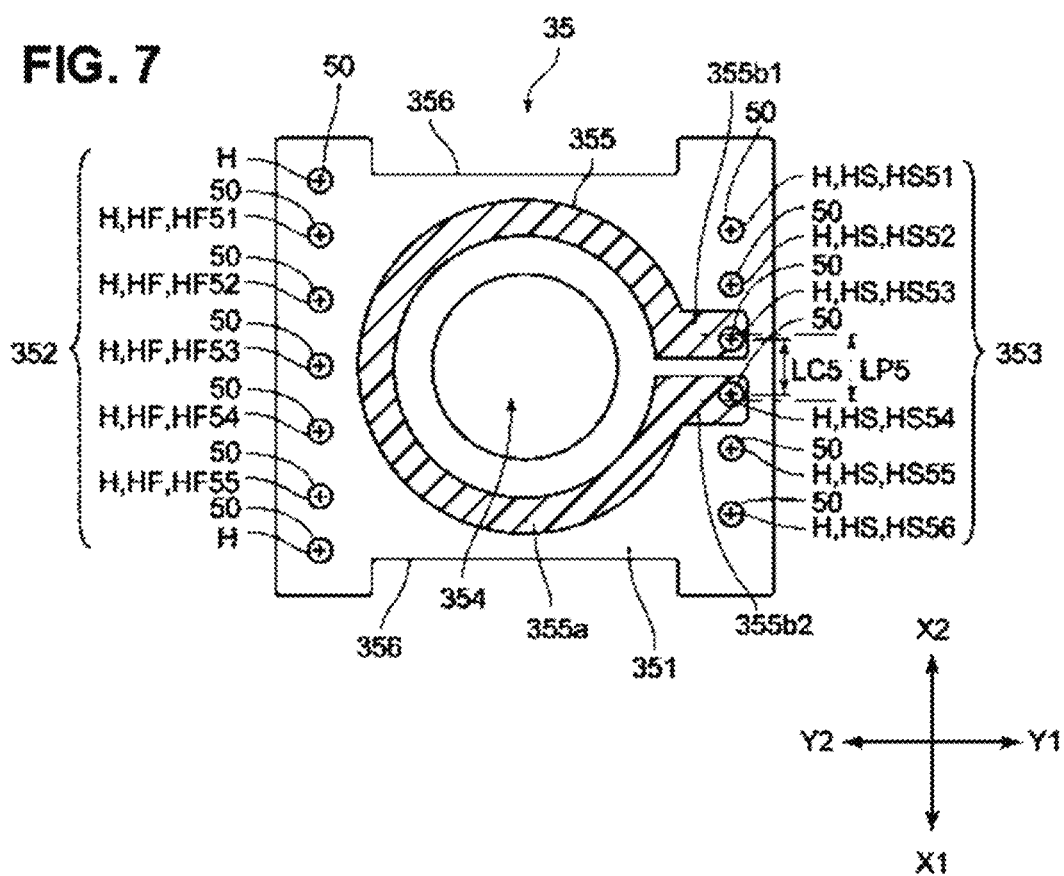

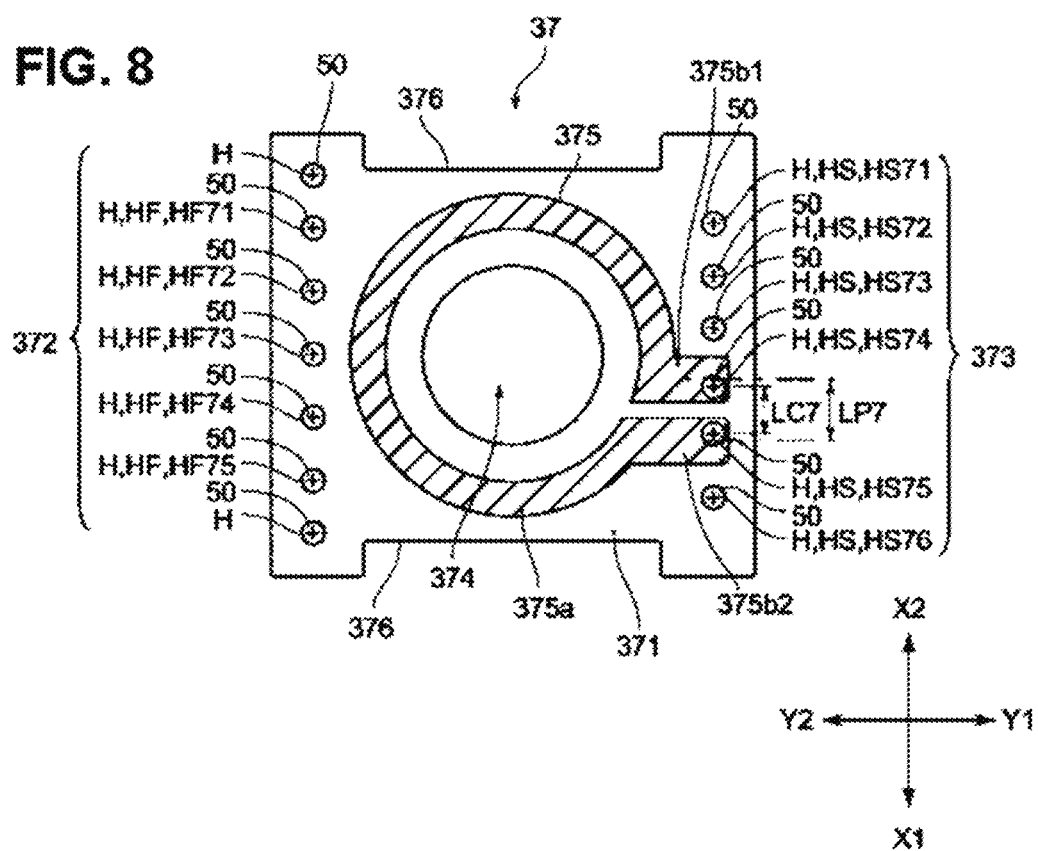

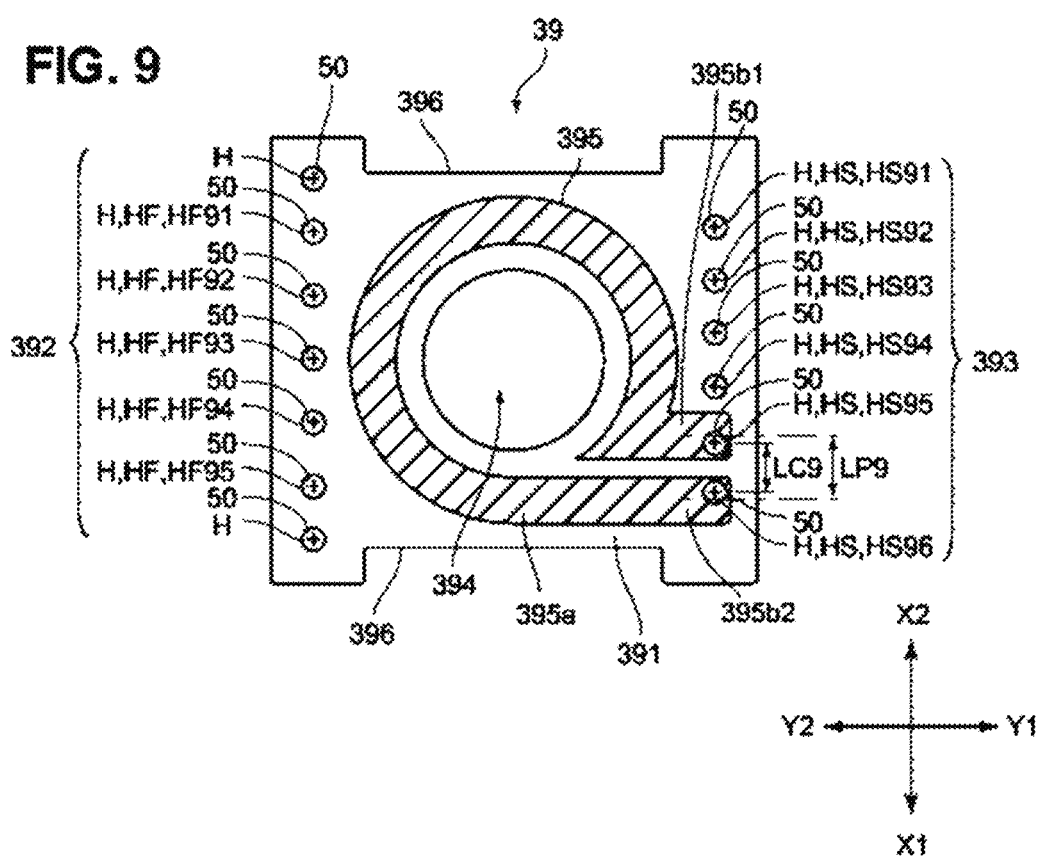

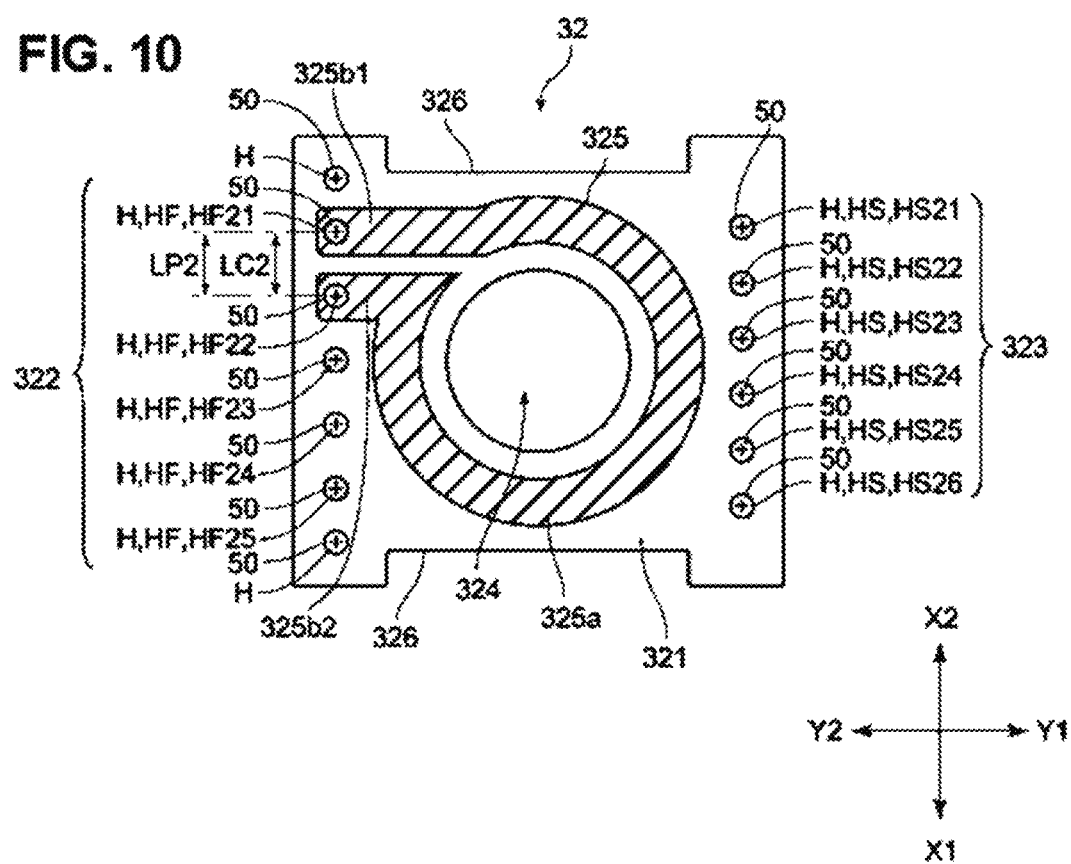

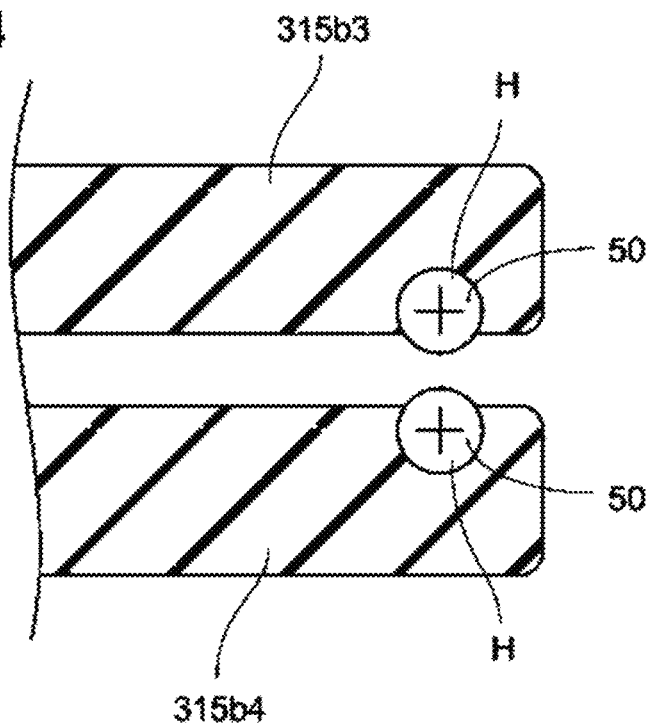
FIG. 14
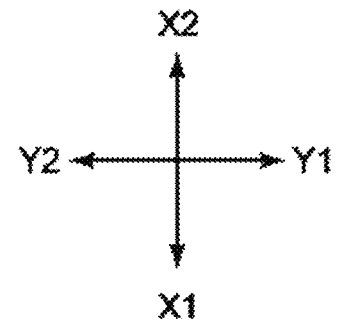

COIL COMPONENT

CROSS REFERENCES TO RELATED APPLICATIONS

The present application claims priority under 35 U.S.C. § 119 to Japanese Patent Application JP2017-160146 filed in the Japanese Patent Office on Aug. 23, 2017, and the entire disclosure of which is incorporated herein by reference.

BACKGROUND OF THE INVENTION

Field of the Invention

The present invention relates to a coil component.

Description of the Related Art

For example, within the coil components such as inductors, transformers and the like, there exists a coil component, such as shown in a patent document 1 (Japanese unexamined patent publication No. H3-183106), which has a constitution in which a coil-pattern is formed on a printed circuit board by a metal foil such as a copper foil and plural number of the printed circuit boards thereof are laminated. In the patent document 1, there is disclosed a constitution in which the distal ends of the coil-patterns which are formed on the printed circuit boards. And the printed circuit boards are connected by means of metal pins to form layers neighboring in an up and down direction.

For each layered printed circuit board which constitutes the coil component, there exists a printed circuit board which is provided with a center hole at the center thereof such as shown, for example, in the patent document 1. In addition, for a core which constitutes the coil component, there exists a core having a middle leg such as, for example, in a case of an E-type core. For the coil component constituted by those elements, there exists a coil component employing a structure in which the middle leg of the core is inserted with respect to the center hole of the printed circuit board and the printed circuit board is sandwiched from above and below by the pair of the cores.

SUMMARY OF THE INVENTION

Meanwhile, for the coil component as mentioned above, there are provided through-holes in order to electrically connect the coil-patterns of the different layers each other and metal pins are inserted into those through-holes. As shown, for example, in the patent document 1, it is common to form such a through-hole approximately at the center in the width direction of the end portion of the pattern-wiring. Then, these pluralities of through-holes are arranged in a state of being apart from each other by a predetermined distance (pitch).

However, in recent years, there has been heightened a request of miniaturization with respect to the coil component. More specifically, in a case that the coil components have the same size of outlooks, there is a request for employing printed circuit boards of layers as many as possible, or applying more metal pins electrically connected. In addition, in a case that the coil components have the same number of the metal pins, it is requested that the widths of the printed circuit boards are formed as narrow as possible.

The present invention was invented in view of the above-mentioned situation and is addressed to provide a coil component which can be formed smaller, or in which it is possible to apply more through-holes.

One aspect of a coil component of the present invention provides a coil component formed by laminating a plurality of substrates each of which includes a pattern-wiring forming a coil, wherein for the substrate, there are arranged a plurality of through-holes; the pattern-wiring is provided with a loop-shaped portion surrounding the circumference of a center hole which penetrates the substrate and is provided with a pair of end portions which extend from the loop-shaped portion toward the intersecting-direction intersecting with the arrangement direction of the through-holes and, which are formed apart from each other with a predetermined insulation-distance; the neighboring two through-holes within the plurality of through-holes penetrate the substrate in a state that at least a part of each of those openings superimpose each of the pair of end portions and is connected electrically with each of the end portions; and an opening of one of the through-holes superimposed on one of the pair of the end portions is provided at a biased position close to the other of the pair of the end portions with respect to the center of the one of the end portions in the intersecting-direction.

Also, further in addition to the aforementioned invention, it is preferable for another aspect of the coil component of the present invention that an opening of the other of the through-holes superimposed on the other of the pair of the end portions is provided at a biased position close to the one of the end portions with respect to the center of the other of the end portions in the intersecting-direction.

Also, further in addition to the aforementioned inventions, it is preferable for another aspect of the coil component of the present invention that for each of the through-holes, the whole opening thereof superimposes each of the end portions in which the circumference of the opening is surrounded by the end portion.

Also, further in addition to the aforementioned inventions, it is preferable for another aspect of the coil component of the present invention that for each of the through-holes, a part of the opening thereof superimpose each of the end portions in which a part of the circumference of the opening is surrounded by the end portion and the remaining part of the opening is located out of the end portion.

Also, further in addition to the aforementioned inventions, it is preferable for another aspect of the coil component of the present invention that the pattern-wiring is provided for at least ¾ or more of one circle along the circumferential direction of the center hole.

Also, further in addition to the aforementioned inventions, it is preferable for another aspect of the coil component of the present invention that for the substrates, there are provided primary substrates in which the pattern-wirings constitute primary coils of a transformer and secondary substrates in which the pattern-wirings constitute secondary coils of the transformer; and the primary substrates and the secondary substrates are alternately laminated.

According to the present invention, it is possible to provide a coil component in which it is possible make the coil component smaller or apply more through-holes.

BRIEF DESCRIPTION OF THE DRAWINGS

FIG. 3 is a plan view which shows a structure of a first-layer substrate of the coil component shown in FIG. 1;

FIG. 4 is a partial plan view which shows a pair of end portions in the plan view shown in FIG. 3 by being enlarged;

FIG. 5 is a plan view which shows a structure of a third-layer substrate of the coil component shown in FIG. 1;

FIG. 6 is a partial plan view which shows a pair of end portions in the plan view shown in FIG. 5 by being enlarged;

FIG. 7 is a plan view which shows a structure of a fifth-layer substrate of the coil component shown in FIG. 1;

FIG. 8 is a plan view which shows a structure of a seventh-layer substrate of the coil component shown in FIG. 1;

FIG. 9 is a plan view which shows a structure of a ninth-layer substrate of the coil component shown in FIG. 1;

FIG. 10 is a plan view which shows a structure of a second-layer substrate of the coil component shown in FIG. 1;

FIG. 14 is a partial plan view which shows a pair of end portions of a coil component relating to a modified example of the present invention by being enlarged.

DESCRIPTION OF THE PREFERRED EMBODIMENTS

Figure 1:
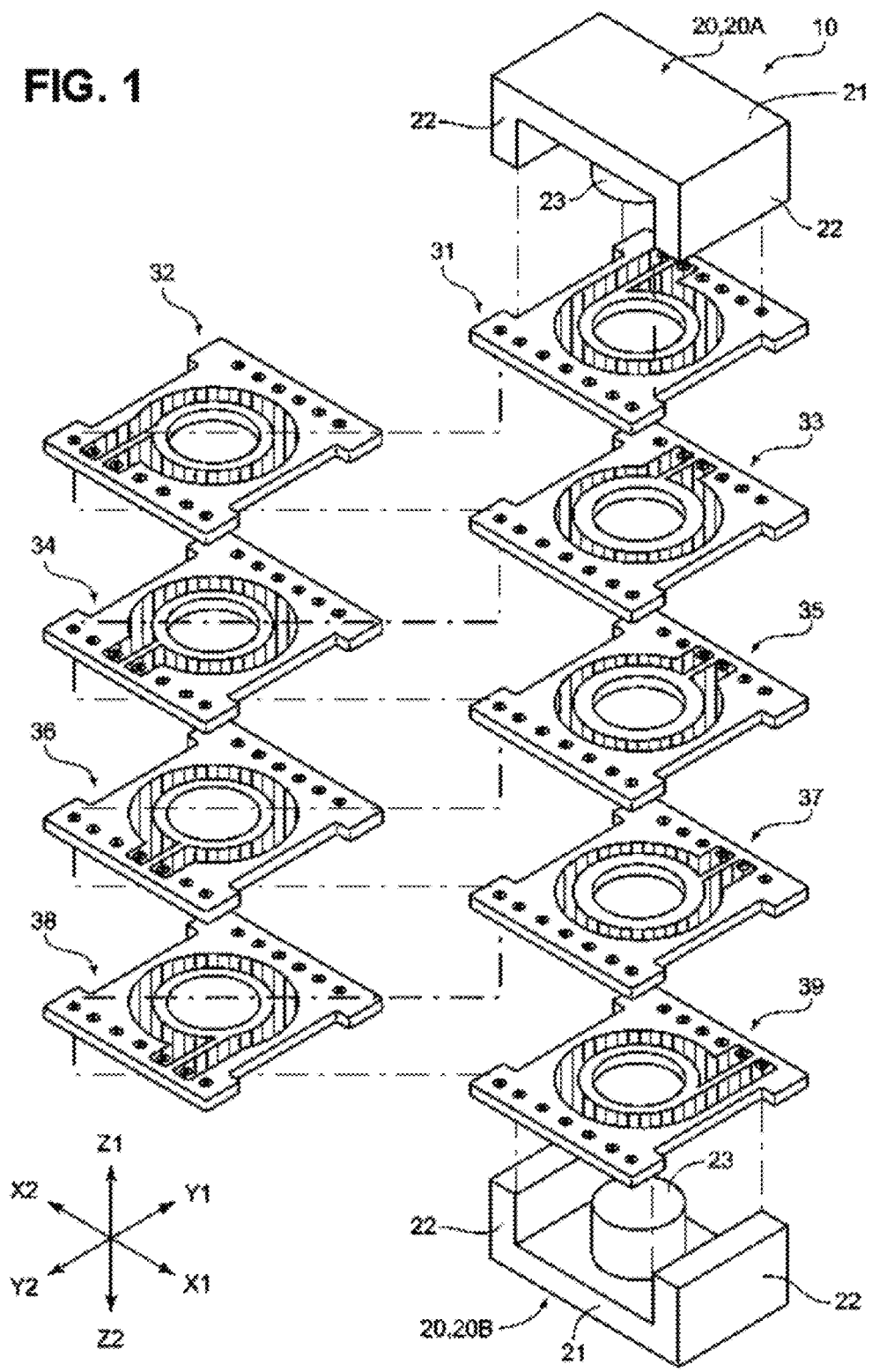
FIG. 1 is an exploded perspective view which shows a structure of a coil component relating to one example of the present invention.

Hereinafter, there will be explained a coil component (10) relating to each example of the present invention while referring to the drawings. It should be noted in the explanation hereinafter that the explanation will be carried out by using XYZ-rectangular coordinate system if necessary. In the XYZ-rectangular coordinate system, the X direction indicates a direction which is in parallel with through-hole rows (312 to 392) and (313 to 393) on the substrate-planes of substrates (31 to 39), in which X1 side indicates bottom-right side in FIG. 1 and X2 side indicates upper-left side opposite thereto. In addition, the Y-direction indicates a direction which is perpendicular to the through-hole rows (312 to 392) and (313 to 393) of the substrate (31 to 39) in FIG. 1, in which Y1 side indicates upper-right side in FIG. 1 and Y2 side indicates bottom left side opposite thereto. In addition, the Z-direction indicates a direction toward which the substrates and a pair of cores (20A and 20B) are piled, in which Z1 side indicates upper side (side on which a core (20A) is positioned) on the page in FIG. 1 and Z2 side indicates lower side (side on which a core (20B) is positioned) on the page in FIG. 1.

Figure 2:
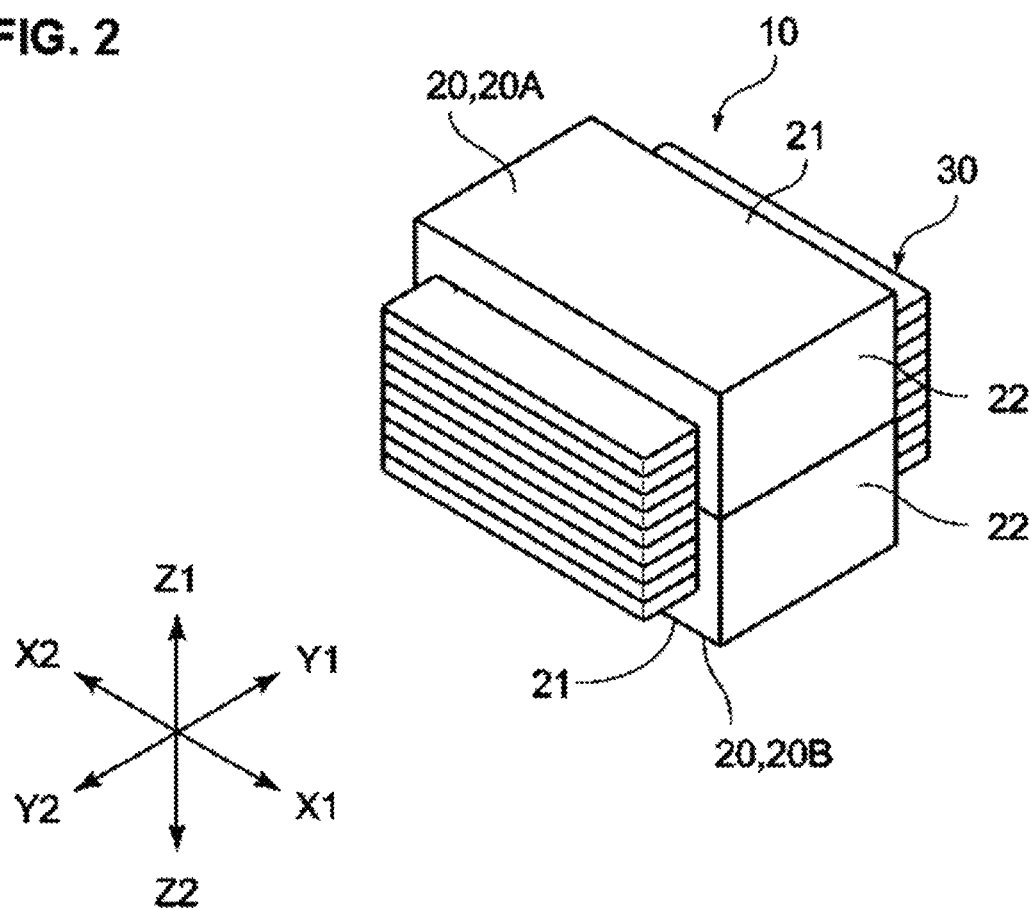
FIG. 2 is a perspective view which shows a coil component relating to one example of the present invention.

FIG. 1 is an exploded perspective view which shows a structure of a coil component 10. FIG. 2 is a perspective view which shows the coil component. As shown in FIG. 1, the coil component (10) is provided with a pair of cores (20A and 20B), a substrate body (30), which is constituted by a plurality of substrates (31 to 39), and connection pins. In the constitution shown in FIG. 1, there exist nine sheets of substrates (31 to 39) and they are laminated aligned.

Each of the pair of cores (20A and 20B) is formed, for example, as an ER core and includes a bottom portion (21), a pair of circumferential walls (22) which stand up from the respective ends in the longitudinal direction of that bottom portion (21), and a column portion (23) which stands up from the center of the bottom portion (21) in the longitudinal direction. By abutting the circumferential walls (22) of the core (20A) and the circumferential walls (22) of the core (20B), and further, by abutting the column portion (23) of the core (20A) and the column portion (23) of the core (20B), there will be formed a closed magnetic-path which encircles the centers of the coil-patterns formed on the substrates (31 to 39) and the outer-circumference sides thereof in a loop shape as will be described later.

The pair of circumferential walls (22) are fitted into positioning concave-portions (316 to 396) of the substrate (31 to 39) as will be described later. In addition, the column portion (23) is provided in a cylindrical shape for the constitution shown in FIG. 1, but it is allowed to employ other shapes such as a prismatic shape and the like. In a case in which the column portion (23) is in such a prismatic shape or the like other than a cylindrical shape, center holes (314 to 394) of the substrate (31 to 39) will be formed in shapes fitting to the column portions (23) It should be noted that the heights of the circumferential walls (22) and the column portion (23) protruding from the bottom portion (21) are substantially identical to each other. The column portion (23) enters into the center holes (314 to 394) of the substrate body (30) (substrates (31 to 39)), which will be described later, and the substrate body (30) is positioned at the space between the circumferential walls (22) and the column portion (23).

In addition, the core (20) utilizes a magnetic material for the material thereof and it is possible for the magnetic material to use, for example, various kinds of magnetic materials and mixtures of various kinds of magnetic materials such as various kinds of ferrites of nickel-based ferrites, manganese-based ferrites or the like; permalloys; sendusts; and the like.

Next, there will be explained the substrate body (30). As shown in FIG. 1, the substrate body (30) is constituted by laminating a plurality of substrates (31 to 39). In the present example, the substrate body (30) is constituted to nine sheets of substrates (31 to 39), but the number of sheets of the substrates which constitute the substrate body (30) is not to be limited by nine sheets and it is allowed to employ any number of sheets if two sheets or more are provided.

In the present example, with respect to the plurality of substrates (31 to 39), from the upper side (Z1 side) as heading toward the lower side (Z2 side), there are sequentially laminated a first-layer substrate (31); a second-layer substrate (32); a third-layer substrate (33); a fourth-layer substrate (34); a fifth-layer substrate (35); a sixth-layer substrate (36); a seventh-layer substrate (37); an eighth-layer substrate (38); and a ninth-layer substrate (39). The first-layer substrate (31), the third-layer substrate (33), the fifth-layer substrate (35), the seventh-layer substrate (37) and the ninth-layer substrate (39) are the substrates corresponding to the secondary coil which constitutes a transformer. In addition, the second-layer substrate (32), the fourth-layer substrate (34), the sixth-layer substrate (36) and the eighth-layer substrate (38) are substrates corresponding to the primary coil which constitutes the transformer.

It should be noted that the configuration of laminating the substrates is not limited by the configuration in which the substrates (32, 34, 36, 38) of the primary and the substrates (31, 33, 35, 37, 39) of the secondary are alternately laminated such as shown in FIG. 1 and, for example, it is allowed to employ any kind of laminated configuration in which substrates of the primary or of the secondary are adjacently laminated at any position, or the like. In addition, it is also allowed to employ a configuration in which after the substrates of the primary are continuously laminated, the substrates of the secondary are consecutively laminated.

FIG. 3 is a plan view which shows a structure of the first-layer substrate (31) (of the secondary). It should be noted that with regard to the respective portions within the first-layer substrate (31) excluding the through-holes (H), the explanations thereof will be carried out basically by using reference numerals formed by combining the numerals "31" and other numerals or alphabets.

As shown in FIG. 3, the substrate (31) is provided with a printed circuit board (311) formed by an electrically insulative material of a resin such as a glass epoxy or of a paper base-material. In addition, on the printed circuit board (311), there are provided through-hole rows (312 and 313) each of which is constituted by a plurality of through-holes (H). For the through-hole rows (312 and 313), there exist a primary through-hole row (312) which becomes an electrical constituent element of the primary transformer and a secondary through-hole row (313) which becomes an electrical constituent element of the secondary transformer.

The primary through-hole row (312) and the secondary through-hole row (313) are formed at different positions within the printed circuit board (311) by sandwiching a pattern-wiring (315) which will be described later. In the present example, the primary through-hole row (312) is provided adjacent to the edge portion on the Y2 side within the printed circuit board (311). In addition, the secondary through-hole row (313) is provided adjacent to the edge portion on the Y1 side within the printed circuit board (311).

In addition, in the present example, the primary through-hole row (312) is provided with total seven through-holes (H). In addition, the secondary through-hole row (313) is provided with a total six through-holes (H). Each through-hole (H) is provided so as to penetrate the printed circuit board (311) and is opened at the front surface and at the rear surface of the printed circuit board (311). In addition, on the inner wall of the through-hole (H), there is coated plating having electrical conductivity, but in a case in which the electrical conductivity is secured by a metal pin or the like inserted as described later, it is allowed to employ a constitution without the coated plating.

In the explanation hereinafter, it is assumed that the through-holes (H) penetrate the printed circuit board (311) so as to go along the Z-direction. And the positions of each of those through-holes (H), including the positions of openings of the through-holes (H), on the XY-plane lie at the same positions. However, it is allowed to employ a constitution in which the positions of other parts of the through-holes (H) on the XY-plane are a little bit deviated with respect to the positions of the openings of the through-holes (H).

It should be noted that the through-holes (H) which are within the total seven through-holes (H) constituting the primary through-hole row (312) and which are positioned at the both ends of the primary through-hole row (312) are not used, in the present example, for the conductive connections with other substrates (32, 34, 36, 38). Therefore, it is possible for the total two of the through-holes (H) at the both ends to be used, for example, as hole-portions for the attachment and fixation and for the positioning. However, it is allowed for the through-holes (H) at the both ends of the primary through-hole row (312) to be used for the conductive connections.

In addition, in the explanation hereinafter, the primary through-holes (H) will be referred to as through-holes (HF) and the secondary through-holes (H) will be referred to as through-holes (HS). In addition, with regard to the seven through-holes (H) on the substrate (31) positioned at the first-layer, when the total five through-holes (HF) excluding the through-holes (H) at the both ends are referred to by distinguished respectively, the through-holes will be referred to, from the X2 side toward the X1 side, as a through-hole (HF11), a through-hole (HF12), a through-hole (HF13), a through-hole (HF14) and a through-hole (HF15) respectively. Similarly, when the six through-holes (HS) on the substrate (31) positioned at the first-layer are referred to by distinguished respectively, the through-holes will be referred to, from the X2 side toward the X1 side, as a through-hole (HS11), a through-hole (HS12), a through-hole (HS13), a through-hole (HS14), a through-hole (HS15) and a through-hole (HS16) respectively.

At the center of the printed circuit board (311), there is provided a center hole (314) which penetrates the aforesaid printed circuit board (311) and the column portion (23) is inserted into this center hole (314). In the present example, the center hole (314) is provided in a circular shape corresponding to the cylindrically-shaped column portion (23), but it is allowed for the center hole (314) to be formed in a shape other than the circular shape.

In addition, on the front surface side (surface side on Z1 side) of the printed circuit board (311), there is provided a pattern-wiring (315). The pattern-wiring (315) is a wiring-portion having a predetermined width which is formed, for example, by an etching or the like of a metal thin film such as a copper and is provided with electrical conductivity. As shown in FIG. 3, the pattern-wiring (315) has such a loop-shaped portion (315a) surrounding the circumference of the center hole (314). The loop-shaped portion (315a) is provided not in a complete circular shape but in a configuration in which a portion of a circle is cut out and thus, the loop-shaped portion (315a) will have two ends thereof. It should be noted that the loop-shaped portion (315a) is provided at least ¾ or more of one circle in the circumferential direction of the center hole (314).

In addition, the pattern-wiring (315) is provided with a pair of end portions (315b1, 315b2) which extend from the respective ends of the loop-shaped portion (315a). Within these portions (315b1 and 315b2), one end portion (315b1) is provided so as to surround the circumference of the opening of the through-hole (HS11). More specifically, the through-hole (HS11) is provided so as to penetrate the one end portion (315b1). Similarly, the other end portion (315b2) is provided so as to surround the circumference of the opening of the through-hole (HF12). More specifically, the through-hole (HF12) is provided so as to penetrate the other end portion (315b2).

Here, the positions of the through-hole (HF11) and through-hole (HF12) at the end portion (315b1) and the end portion (315b2) are shown in FIG. 4. FIG. 4 is a partial plan view which shows the enlarged pair of end portions (315b1, 315b2). As shown in FIG. 4, in the width direction (X-direction) of the end portion (315b1), the through-hole (H511) is provided so as to deviate toward the other side (X1 side) from the center of the end portion (315b1) in its width direction (X-direction). In addition, in the width direction (X direction) of the end portion (315b2), the through-hole (HS12) is provided so as to deviate toward one side (X2 side) from the center of the end portion (315b2) in its width direction (X-direction).

More specifically, the through-holes (HS11 and HS12) are provided such that compared with the distance (LP1) between the center of the end portion (315b1) in its width direction (X-direction) and the center of the end portion (315b2) in its width direction (X-direction), the distance (LC1) between the center of the through-hole (HS11) and the center of the through-hole (HS12) becomes shorter. Therefore, compared with a case in which the through-hole (HS11) is positioned at the center of the end portion (315b1) in its width direction (X-direction) and also in which the through-hole (HS12) is positioned at the center of the end portion (315b2) in its width direction (X-direction), it becomes possible to narrow the pitch between the through-hole (HS11) and the through-hole (HS12).

It should be noted that the substrate (31) is provided also with the positioning concave-portions (316). The positioning concave-portions (316) are provided in a configuration in which within four sides of the rectangular-shaped printed circuit board (311), the remaining two sides excluding two sides on which the primary through-hole row (312) and the secondary through-hole row (313) are provided are recessed toward the center hole (314) as much as predetermined amounts. At these positioning concave-portions (316), the aforementioned circumferential walls (22) are to be positioned and therefore, the positions of the cores (20) with respect to the substrate body (30) are defined.

Here, the through-hole (HS11) is connected to an external conductive portion, but the through-hole (HS12) is electrically connected to the through-hole (HS32) of the third-layer substrate (33) of the secondary through a metal pin (50). Hereinafter, there will be explained the third-layer substrate (33) which is electrically connected with the first-layer substrate (31) through the metal pin (50).

FIG. 5 is a plan view which shows a structure of the third-layer substrate (33) (of the secondary). In addition, FIG. 6 is a partial plan view which shows an enlarged pair of end portions (335b1, 335b2). In the explanation hereinafter, with regard to the structures within the third-layer substrate (33) which are common with those of the first-layer substrate (31), the explanations thereof will be omitted. In addition, with regard to the respective portions of the substrate (33) within the third-layer substrate (33) excluding the through-holes (H), the explanations thereof will be carried out basically by appending the numerals "33" instead of the numerals "31" in the first-layer and further by appending other numerals or alphabets thereto.

As clear from the comparison of FIG. 3 and FIG. 5, the through-hole (HS12) and the through-hole (HF32) are provided so as to be positioned at the same position in the X direction. In addition, as shown in FIG. 6, in the width direction (X-direction) of the end portion (335b1), the through-hole (HS32) is provided so as to deviate toward the other side (X1 side) from the center of the end portion (335b1) in its width direction (X-direction). In addition, in the width direction (X direction) of the end portion (335b2), the through-hole (HS33) is provided so as to deviate toward one side (X2 side) from the center of the end portion (335b2) in its width direction (X-direction).

More specifically, the through-holes (HS32 and HS33) are provided such that compared with the distance (LP3) between the center of the end portion (335b1) in its width direction (X-direction) and the center of the end portion (335b2) in its width direction (X-direction), the distance (LC3) between the center of the through-hole (HS32) and the center of the through-hole (HS33) becomes shorter. Also in this case, compared with a case in which the through-hole (HS32) is positioned at the center of the end portion (335b1) in its width direction (X-direction) and also in which the through-hole (HS33) is positioned at the center of the end portion (335b2) in its width direction (X-direction), it becomes possible to narrow the pitch between the through-hole (HS32) and the through-hole (HS33).

It should be noted that the through-hole (HS12) and the through-hole (HS32) are positioned at the same position on the XY-plane. Here, as clear from the comparison of FIG. 4 and FIG. 6, when taking the through-hole (HS12) and the through-hole (HS32) as references, the end portion (315b2) is positioned so as to deviate toward the other side (X1 side) with respect to the through-hole (HS12). In addition, with respect to the through-hole (HS32) which is positioned on the same XY-plane as the through-hole (HS12), the end portion (335b1) is positioned so as to deviate toward the one side (X2 side).

As described above, for the first-layer substrate (31), the distance (LC1) between the through-hole (HS11) and the through-hole (HS12) is provided to be narrow compared with the distance (LP1) between the end portion (315b1) and the end portion (315b2). In addition, for the third-layer substrate (33), the distance (LC3) between the through-hole (HS32) and the through-hole (HS33) is provided to be narrow compared with the distance (LP3) between the end portion (335b1) and the end portion (335b2).

FIG. 7 is a plan view which shows a structure of a fifth-layer substrate (35) (secondary). In the explanation hereinafter, with regard to the structures, within the fifth-layer substrate (35), which are common with those of the first-layer substrate (31), the explanations thereof will be omitted. Similarly, with regard to the structures, within each of the seventh-layer and the ninth-layer substrates (37, 39) shown in FIGS. 8 and 9 respectively, which are common with those of the first-layer substrate (31), the explanations thereof will be omitted.

In addition, with regard to the respective portions within the fifth-layer substrate (35) excluding the through-holes (H), the explanations thereof will be carried out basically by appending the numerals "35" instead of the numerals "31" in the first-layer and further by appending other numerals or alphabets thereto. Similarly, also with regard to the respective portions of the substrates (37, 39) within the seventh-layer and the ninth-layer substrates (37, 39) which are respectively shown in FIGS. 8 and 9 excluding the through-holes (H), the explanations thereof will be carried out basically by appending the numerals ("37" and "39") instead of the numerals "31" in the first-layer and further by appending other numerals or alphabets thereto.

As clear from FIG. 7, similarly as the abovementioned first-layer substrate (31) and the third-layer substrate (33), for the fifth-layer substrate (35), the distance (LC5) between the through-hole (HS53) and the through-hole (HS54) is provided to be narrow compared with the distance (LP5) between the end portion (355b1) and the end portion (355b2).

FIG. 8 is a plan view which shows a structure of a seventh-layer substrate (37) (secondary). In this seventh-layer substrate (37), the distance (LC7) between the through-hole (HS74) and the through-hole (HS75) is provided to be narrow compared with the distance (LP7) between the end portion (375b1) and the end portion (375b2).

FIG. 9 is a plan view which shows a structure of a ninth-layer substrate (39) (secondary). Also in the ninth-layer substrate (39), the distance (LC9) between the through-hole (HS95) and the through-hole (HS96) is provided to be narrow compared with the distance (LP9) between the end portion (395b1) and the end portion (395b2).

The above description shows the relationship between the distance (LP1, LP3, LP5, LP7, LP9) and the distance (LC1, LC3, LC5, LC7, LC9) on the secondary substrate (31, 33, 35, 37, 39).

Next, there will be shown structures of the primary substrates (32, 34, 36, 38) in the figures from FIG. 10 to FIG. 13. Here, as clear from FIG. 1, the primary substrates (32, 34, 36, 38) are total four sheets and the number of those sheets lies in a number which is less as much as one compared with the total five sheets of secondary substrates (31, 33, 35, 37, 39). In the explanation hereinafter, with regard to the structures within each of the second-layer, the fourth-layer, the sixth-layer and the eighth-layer substrates (32, 34, 36, 38) shown in the figures from FIG. 10 to FIG. 13, which are common with those of the first-layer substrate (31), the explanations thereof will be omitted.

In addition, with regard to the respective portions of the substrates (32, 34, 36, 38) within the respective second-layer, fourth-layer, sixth-layer and eighth-layer substrates (32, 34, 36, 38) excluding the through-holes (H), the explanations thereof will be carried out basically by appending the numerals "32", "34", "36", "38" respectively instead of the numerals "31" in the first-layer and further by appending other numerals or alphabets thereto.

FIG. 10 is a plan view which shows a structure of a second-layer substrate (32) (primary). As shown in FIG. 10, with regard to the width direction (X direction) of an end portion (325b1), a through-hole (HF21) is positioned at the center in the width direction (X direction) of the end portion (325b1). In addition, with regard to the width direction (X direction) of an end portion (325b2), a through-hole (HF22) is positioned at the center in the width direction (X direction) of the end portion (325b2). For this reason, the pitch between the primary through-hole (HF21) and through-hole (HF22) becomes wide compared with the pitch between the secondary through-hole (HS11) and through-hole (HS12).

The fact that the distance between the primary through-hole (HF21) and through-hole (HF22) was made to be wider than the pitch between the secondary through-hole (HS11) and through-hole (HS12) in this manner is based on the following reason. More specifically, in the constitution shown in FIG. 1, the primary substrates (32, 34, 36, 38) are total four sheets and on the other hand, the secondary substrates (31, 33, 35, 37, 39) are total five sheets. For this reason, the number of through-holes (H) for each of the primary substrates (32, 34, 36, 38) is made to be five for each thereof. On the other hand, the number of through-holes (H) for each of the secondary substrates (31, 33, 35, 37, 39) is made to be six for each thereof. For this reason, for each of the primary substrates (32, 34, 36, 38), the number of through-holes (H) lies in a number which is less as much as one compared with that for each of the secondary substrates (31, 33, 35, 37, 39).

For this reason, it becomes possible for the pitch (distance LP2) between the primary through-hole (HF21) and through-hole (HF22) to be made wider than the pitch (distance LC2) between the secondary through-hole (HS11) and through-hole (HS12).

However, it is needless to say that it is also possible to employ a configuration in which the pitch between the primary through-hole (HF21) and through-hole (HF22) is made to be identical as the pitch between the secondary through-hole (HS11) and through-hole (HS12). More specifically, it is possible to employ a configuration in which the through-hole (HF21) is provided so as to deviate toward the other side (X1 side) from the center of the end portion (325b1) in its width direction (X direction). In addition, it is possible to employ a configuration in which the width direction (X direction) of the end portion (325b2), the through-hole (HF22) is provided so as to deviate toward one side (X2 side) from the center of the end portion (325b2) in its width direction (X direction). Thus, it is possible to provide the through-holes (HF21) and (HF22) are provided such that compared with the distance (LP2) between the center of the end portion (325b1) in the width direction (X direction) and the center of the end portion (325b2) in the width direction (X direction), the distance (LC2) between the center of the through-hole (HF21) and the center of the through-hole (HF22) becomes shorter.

Figure 11:
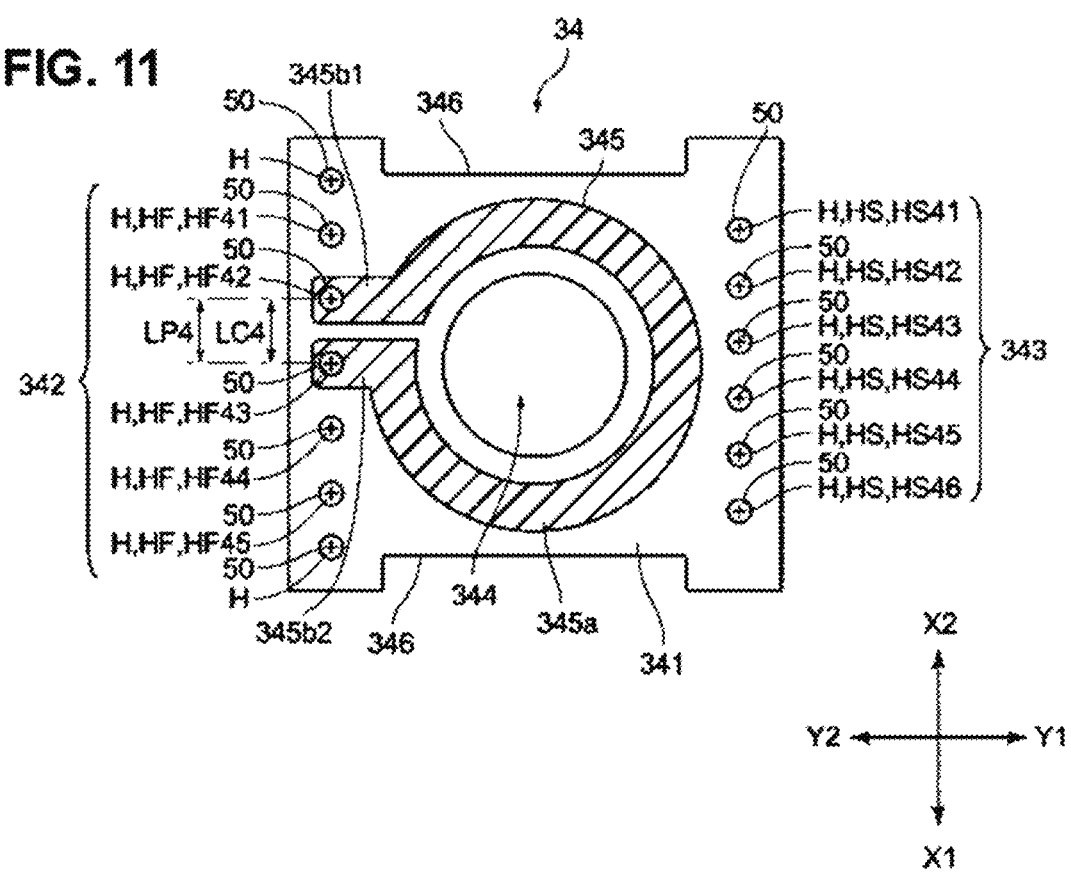
FIG. 11 is a plan view which shows a structure of a fourth-layer substrate of the coil component shown in FIG. 1.
Figure 12:
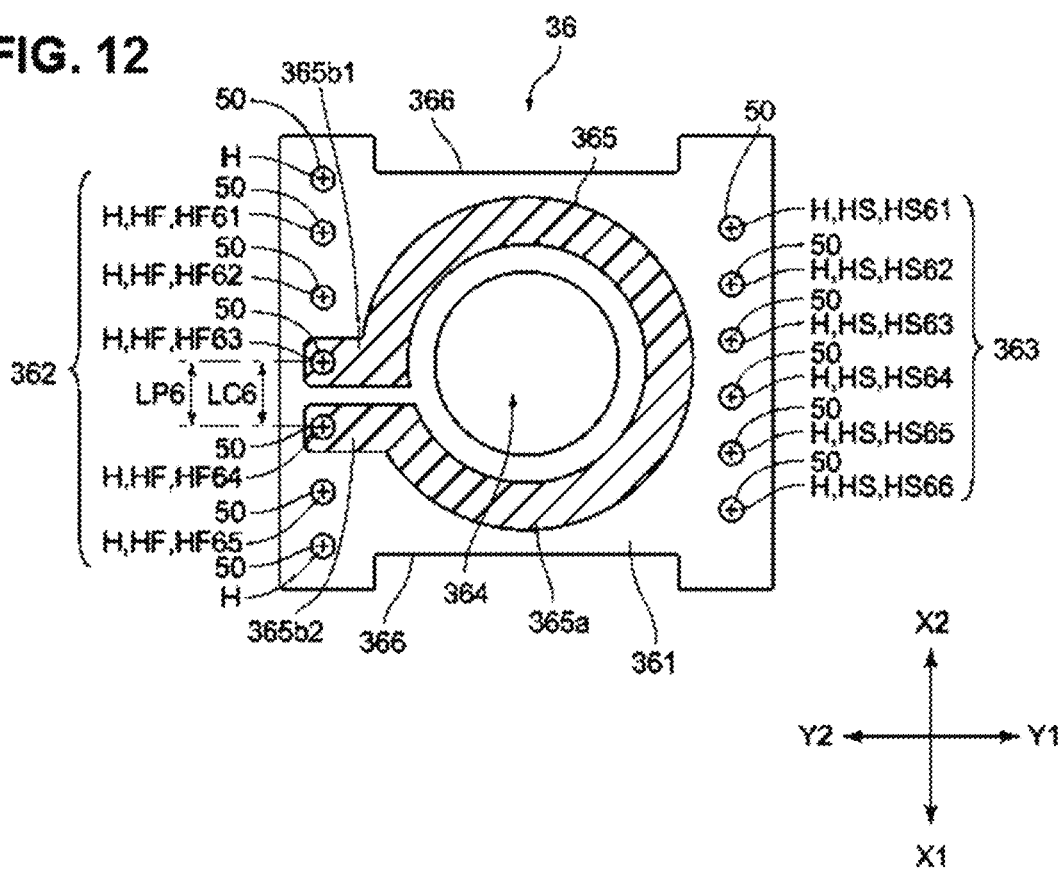
FIG. 12 is a plan view which shows a structure of a sixth-layer substrate of the coil component shown in FIG. 1.
Figure 13:
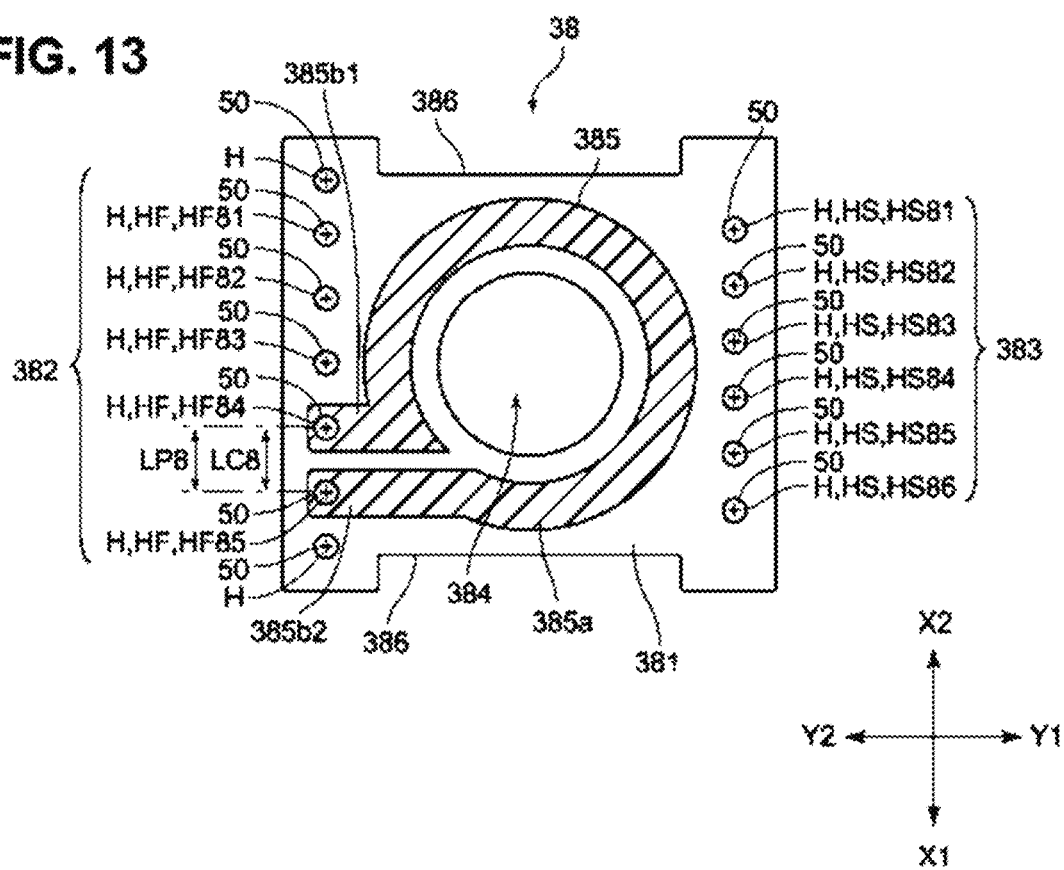
FIG. 13 is a plan view which shows a structure of an eighth-layer substrate of the coil component shown in FIG. 1.

Next, there will be explained the fourth-layer, sixth-layer and eighth-layer substrates (34, 36, 38). FIG. 11 is a plan view which shows a structure of the fourth-layer substrate (34) (primary). FIG. 12 is a plan view which shows a structure of the sixth-layer substrate (36) (primary). FIG. 13 is a plan view which shows a structure of the eighth-layer substrate (38) (primary).

With regard to these fourth-layer, sixth-layer and eighth-layer substrates (34, 36, 38), it is possible to apply the matters which were explained in relation to the second-layer substrate (32) in FIG. 10. Therefore, the explanations with regard to the details thereof will be omitted.

In a case of manufacturing the coil component (10) having a constitution as mentioned above, first, the substrate body (30) is formed by laminating the substrates (31 to 39) in a state of being positionally aligned. Thereafter, the metal pins (50) are inserted into the respective through-holes (H). In addition, before or after the insertion of the metal pins (50), the cores (20A and 20B) are attached in a state of being aligned positionally with respect the substrate body (30). At that time, the circumferential walls (22) are positioned the positioning concave-portions (316 to 396) which are provided at the substrates (31 to 39) and concurrently, the column portions (23) are positioned at the center holes (314 to 394) which are provided at the substrates (31 to 39). In this manner, there will be formed the coil component 10.

Effect

According to the coil component (10) having the constitution such as mentioned above, for the substrate (31 to 39), there are arranged a plurality of through-holes (H); the pattern-wiring (315 to 395) is provided with a loop-shaped portion (315a to 395a) surrounding the circumference of the center hole that penetrates the substrate and is provided with a pair of end portions (pair of (315b1 to 395b1) and (315b2 to 395b2)) which extend from the loop-shaped portion (315a to 395a) toward the intersecting-direction intersecting with the arrangement direction of the through-holes and concurrently, which are formed apart from each other with a predetermined insulation-distance; and the neighboring two through-holes within the plurality of through-holes penetrate the substrate (31 to 39) in a state that at least a part of each of those openings superimpose each of the pair of end portions (pair of (315b1 to 395b1) and (315b2 to 395b2)) and is connected electrically with each of the end portions (each of (315b1 to 395b1) and (315b2 to 395b2)). In addition, the opening of one of the through-holes superimposed on one of the end portions (315b1 to 395b1) within the pair of end portions (pair of (315b1 to 395b1) and (315b2 to 395b2)), is provided at a biased position close to the other of the end portion (315b2 to 395b2) with respect to the center of the one of the end portion (315b1 to 395b1) in the intersecting-direction.

By employing such a constitution, the distance (LC1, LC3, LC5, LC7, LC9) between the through-hole (H) positioned at the one of the end portions (315b1, 335b1, 355b1, 375b1, 395b1) and the through-hole (H) positioned at the other of the end portions (315b2, 335b2, 355b2, 375b2, 395b2) can be made narrow compared with the distance (LP1, LP3, LP5, LP7, LP9) between the one of the end portions (315b1, 335b1, 355b1, 375b1, 395b1) and the other of the end portions (315b2, 335b2, 355b2, 375b2, 395b2). More specifically, the pitch between the through-holes (H) can be made narrow compared with the pitch between the pair of end portions (between (315b1, 335b1, 355b1, 375b1, 395b1) and (315b2, 335b2, 355b2, 375b2, 395b2)).

For this reason, it becomes possible to reduce the size of the coil component (10) by the length reduced from the pitch between the through-holes (H). In addition, for the identical sized coil component 10, it is possible to increase the number of the through-holes (H) and the number of the metal pins (50) which are plugged-in the through-holes (H) compared with those of a currently-used product. Thus, it becomes possible to increase the number of the turns of the coil-patterns and it becomes possible to improve the characteristic of the coil component 10.

In addition, in the present example, the opening of the other of the through-holes (H) at the other of the end portions (315b2, 335b2, 355b2, 375b2, 395b2) within the pair of the end portions (pair of (315b1, 335b1, 355b1, 375b1, 395b1) and (315b2, 335b2, 355b2, 375b2, 395b2)) is provided at a biased position close to the one of the end portions (315b1, 335b1, 355b1, 375b1, 395b1) with respect to the center of the other of the end portions (315b2, 335b2, 355b2, 375b2, 395b2) in the intersecting-direction (for example, X direction).

For this reason, it is possible to make the pitch between the through-holes (H) narrower furthermore compared with the pitch between the pair of the end portions (between (315b1, 335b1, 355b1, 375b1, 395b1) and (315b2, 335b2, 355b2, 375b2, 395b2)). Therefore, it becomes possible to reduce the size of the coil component (10) furthermore by the length reduced from the pitch between the through-holes (H). In addition, for the identical sized coil component 10, it is possible to increase the number of the through-holes (H) and the number of the metal pins (50) which are plugged-in the through-holes (H) compared with those of a currently-used product.

In addition, in the present example, for each of through-holes (H), the whole opening thereof superimpose each of the end portions (each of (315b1, 335b1, 355b1, 375b1, 395b1) and (315b2, 335b2, 355b2, 375b2, 395b2)), and the circumference of the opening is surrounded by each of the end portions (each of (315b1, 335b1, 355b1, 375b1, 395b1) and (315b2, 335b2, 355b2, 375b2, 395b2)).

For this reason, it becomes possible to improve reliability of the electrical connection between the pattern-wirings (315 to 395) of the different layers.

In addition, in the present example, it is preferable for each of the pattern-wirings (315 to 395) to be provided for at least ¾ or more of one circle in the circumferential direction of each of the center holes (314 to 394). In a case of constituting the pattern-wiring in this manner, it becomes a state in which each of the pattern-wirings (315 to 395) surrounds most of the circumference of each of the center holes (314 to 394). Thus, by electrically connecting respective layers of the pattern-wirings (315 to 395) through the metal pins (50), it is possible for the pattern-wirings to be functioned as coils excellently.

In addition, in the present example, for the substrates (31 to 39), there are provided the primary substrates (32, 34, 36, 38) in which the pattern-wirings (325, 345, 365, 385) constitute primary coils of the transformer and the secondary substrates (31, 33, 35, 37, 39) in which the pattern-wirings (315, 335, 355, 375, 395) constitute secondary coils of the transformer, and the primary substrates (32, 34, 36, 38) and the secondary substrates (31, 33, 35, 37, 39) are alternately laminated.

For this reason, at least in the secondary substrate (31, 33, 35, 37, 39), by achieving a narrowed pitch formed by narrower spacings between the through-holes (H), it is possible to increase the stackable number of secondary substrates (31, 33, 35, 37, 39) if the coil component (10) has an identical size when compared with that of a currently-used coil component. Thus, it becomes possible to increase the number of turns of the secondary coil. In addition, in a case of supposing that the laminated number of the secondary substrates (31, 33, 35, 37, 39) is not to be increased when compared with that of a currently-used coil component, it becomes possible to achieve miniaturization of the coil component.

Modified Example

In the aforementioned example, there was employed a constitution in which for each of the through-holes (H), the whole opening thereof superimpose each of the end portions (each of (315b1, 335b1, 355b1, 375b1, 395b1) and (315b2, 335b2, 355b2, 375b2, 395b2)) and in which the circumference of the opening is surrounded by each of the end portions (each of (315b1, 335b1, 355b1, 375b1, 395b1) and (315b2, 335b2, 355b2, 375b2, 395b2)). However, it is allowed to employ a constitution as shown in FIG. 13 instead of such a constitution. FIG. 14 is a partial plan view which shows a pair of end portions (315b3, 315b4) of a coil component relating to a modified example of the present invention by being enlarged.

In the constitution shown in FIG. 14, for each of the through-holes (H), a portion of the opening thereof superimpose each of the end portions (315b3, 315b4) in which a portion of the circumference of the opening thereof is surrounded by each of the end portions (315b3, 315b4). In addition, there is employed a constitution in which the remaining portion of the opening of each of the through-holes (H) is located out of each of the end portions (315b3, 315b4).

In a case of employing this constitution, it is possible to narrow the pitch between the through-holes (H) furthermore compared with the pitch between the pair of end portions (315b3, 315b4). Therefore, it becomes possible to achieve the miniaturization of the coil component (10) furthermore as much amount as it is possible to narrow the pitch between the through-holes (H). In addition, for the identical sized coil component (10), it is possible to increase the number of the through-holes (H) and the number of the metal pins (50) which are plugged-in the through-holes (H) compared with those of a currently-used product.

In addition, in each of the aforementioned examples, it is assumed that rigid printed circuit boards (311 to 391) are used for the substrates (31 to 39) respectively. However, the printed circuit board is not to be limited by the rigid board and it is allowed to employ a flexible printed circuit board.

In addition, in each of the aforementioned examples, it is assumed that the core (20) is formed by an ER core. However, it is possible for the core to be changed variously to a core using two E-type cores, to a core using an E-type core and an I-type core, to another type's core, or the like.

In addition, in the aforementioned example, for the one of the end portions (315b1, 335b1, 355b1, 375b1, 395b1), the through-hole (H) is provided so as to deviate toward the other side (X1 side) from the center of the end portion (315b1, 335b1, 355b1, 375b1, 395b1) in the width direction (X direction). In addition, in the width direction (X-direction) of the end portions (315b2, 335b2, 355b2, 375b2, 395b2), the through-hole (H) is provided so as to deviate toward the one side (X2 side) from the center of the end portion (315b2, 335b2, 355b2, 375b2, 395b2) in the width direction (X direction).

However, without employing such a constitution, it is allowed to employ a constitution in which within the pair of the end portions (pair of (315b1, 335b1, 355b1, 375b1, 395b1) and (315b2, 335b2, 355b2, 375b2, 395b2)), only the through-holes (H) which are positioned at the one of the end portions (315b1, 335b1, 355b1, 375b1, 395b1) are made to deviate toward the other side (X1 side) and concurrently, the through-holes (H) which are positioned at the other of the end portions (315b2, 335b2, 355b2, 375b2, 395b2) are positioned at the centers of the end portions (315b2, 335b2, 355b2, 375b2, 395b2) in the width direction. In addition, it is also allowed to employ a constitution in which within the pair of the end portions (pair of (315b1, 335b1, 355b1, 375b1, 395b1) and (315b2, 335b2, 355b2, 375b2, 395b2)), only the through-holes (H) which are positioned at the other of the end portions (315b2, 335b2, 355b2, 375b2, 395b2) are made to deviate toward the one side (X2 side) and concurrently, the through-holes (H) which are positioned at the one of the end portions (315b1, 335b1, 355b1, 375b1, 395b1) are positioned at the centers of the end portions (315b1 to 355b1) in the width direction. In addition, it is allowed, also with regard to the respective through-holes (H) of the primary through-hole row (312), to employ a similar structure.

In addition, in the examples mentioned above, the number of sheets of the secondary substrates (31, 33, 35, 37, 39) is larger than the number of sheets of the primary substrates (32, 34, 36, 38). However, it is possible to make the number of sheets of the primary substrates larger than the number of sheets of the secondary substrates and, in addition, it is also possible to make the number of sheets of the primary substrates and the number of sheets of the secondary substrates to be the same numbers. Also for those cases, it is needless to say, with respect to at least one side within the primary substrates and the secondary substrates, that it is possible to employ a constitution for achieving a narrow pitch between the through-holes (H) as mentioned above.

In addition, the coil components in the examples mentioned above are not to be limited by transformers and it is possible to apply the present invention to other coil components in the examples mentioned a such as inductors, choke-coils and the like.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A coil component formed by laminating a plurality of substrates each of which includes a pattern-wiring forming a coil, wherein
   for each of the plurality of substrates, a plurality of through-holes are arranged;
   the pattern-wiring is provided with a loop-shaped portion surrounding a circumference of a center hole which penetrates the substrate and is provided with a pair of end portions which extend from the loop-shaped portion along a direction perpendicular to an arrangement direction along which two neighboring through-holes of the through-holes are arranged, and concurrently, which are formed apart from each other with a predetermined insulation-distance;
   the two neighboring through-holes within the plurality of through-holes penetrate the substrate in a state that at least a part of an opening of each through-hole superimposes each of the pair of end portions and is connected electrically with each of the end portions;
   the opening of one through-hole of the two neighboring through-holes at one end portion of the pair of end portions is provided at a biased position with respect to a center of the one end portion,
   the opening of an other through-hole of the two neighboring through-holes at an other end portion of the pair of end portions is provided at a biased position with respect to a center of the other end portion, and
   a distance between the center of the one end portion and the center of the other end portion is greater than a distance between a center of the opening of the one through-hole and a center of the other through-hole for each of the plurality of substrates.

2. The coil component according to claim 1, wherein for each of the through-holes, the whole opening thereof superimpose each of the end portions in which a circumference of the opening is surrounded by the end portion.

3. The coil component according to claim 1, wherein for each of the through-holes, a part of the opening thereof superimpose each of the end portions in which a part of a circumference of the opening is surrounded by the end portion and a remaining part of the opening is located out of the end portion.

4. The coil component according to claim 1, wherein the pattern-wiring is provided for at least ¾ or more of one turn in the circumferential direction of the center hole.

5. The coil component according to claim 1; wherein
   for the substrates, there are provided primary substrates in which the pattern-wirings constitute primary coils of a transformer and secondary substrates in which the pattern-wirings constitute secondary coils of the transformer; and
   the primary substrates and the secondary substrates are alternately laminated.

6. The coil component according to claim 1, wherein
   one end portion of the pattern-wiring has a first edge along the arrangement direction, and a second edge along the direction perpendicular to the arrangement direction, and a third edge,
   an other end portion of the pattern-wiring has a first edge along the arrangement direction, and a second edge and a third edge both along the direction perpendicular to the arrangement direction, and
   the length of both the third edges are the same.

7. The coil component according to claim 6, wherein
   one through-hole is formed inside an area configured by the first edge, the second edge and the third edge of the one end-portion, and
   an other through-hole is formed inside an other area configured by the first edge, the second edge and the third edge of the other end-portion.

* * * * *